United States Patent
Yoo

(10) Patent No.: US 11,508,846 B2
(45) Date of Patent: Nov. 22, 2022

(54) FERROELECTRIC MEMORY DEVICE

(71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 83 days.

(21) Appl. No.: 17/030,523

(22) Filed: Sep. 24, 2020

(65) Prior Publication Data

US 2021/0013345 A1 Jan. 14, 2021

Related U.S. Application Data

(62) Division of application No. 16/188,290, filed on Nov. 13, 2018, now abandoned.

(30) Foreign Application Priority Data

Mar. 15, 2018 (KR) .......................... 10-2018-0030344

(51) Int. Cl.
*H01L 29/15* (2006.01)
*H01L 31/0312* (2006.01)
*H01L 29/78* (2006.01)
*H01L 29/51* (2006.01)
*H01L 29/16* (2006.01)
*H01L 29/161* (2006.01)

(52) U.S. Cl.
CPC ...... *H01L 29/78391* (2014.09); *H01L 29/161* (2013.01); *H01L 29/1608* (2013.01); *H01L 29/513* (2013.01); *H01L 29/516* (2013.01); *H01L 29/785* (2013.01); *H01L 29/517* (2013.01); *H01L 29/518* (2013.01)

(58) Field of Classification Search
CPC ............ H01L 29/78391; H01L 29/516; H01L 29/1608; H01L 29/513; H01L 29/785; H01L 29/161; H01L 29/518; H01L 29/517; H01L 27/1159; H01L 27/11592
See application file for complete search history.

(56) References Cited

U.S. PATENT DOCUMENTS

| | | | |
|---|---|---|---|
| 7,791,149 B2 | 9/2010 | Boescke | |
| 8,785,995 B2 | 7/2014 | Dubourdieu et al. | |
| 9,159,829 B1 * | 10/2015 | Ramaswamy | ...... H01L 29/6684 |
| 9,679,893 B2 | 6/2017 | Yan | |
| 2008/0111242 A1 | 5/2008 | Lin | |
| 2012/0223387 A1 | 9/2012 | Cui | |
| 2012/0299155 A1 | 11/2012 | Liu | |
| 2014/0264517 A1 | 9/2014 | Kim | |
| 2015/0214323 A1 | 7/2015 | Dubourdieu et al. | |
| 2016/0118404 A1 | 4/2016 | Peng | |
| 2016/0322479 A1 | 11/2016 | Liu | |

(Continued)

*Primary Examiner* — Ismail A Muse

(57) ABSTRACT

A ferroelectric memory device according to one embodiment includes a semiconductor substrate, a fin structure disposed on the semiconductor substrate and having a trench, the trench having a bottom surface and a sidewall surface; a ferroelectric layer disposed on the bottom surface and the sidewall surface of the trench; a plurality of resistor layers stacked vertically in the trench, each resistor layer of the plurality of resistor layers having a different electrical resistance; and a gate electrode layer electrically connected to the each resistor layer in the plurality of resistor layers. The plurality of resistor layers are disposed between the gate electrode layer and the ferroelectric layer.

18 Claims, 16 Drawing Sheets

(56) References Cited

U.S. PATENT DOCUMENTS

| | | |
|---|---|---|
| 2017/0040331 A1 | 2/2017 | Van Houdt |
| 2018/0166453 A1 | 6/2018 | Muller |
| 2019/0115445 A1 | 1/2019 | Teo |
| 2019/0131458 A1* | 5/2019 | Yoo .................. H01L 45/144 |
| 2019/0156879 A1 | 5/2019 | Tsu Kam Oto |
| 2019/0319108 A1 | 10/2019 | Kitti |
| 2019/0334010 A1 | 10/2019 | Avci |
| 2019/0348539 A1* | 11/2019 | Yoo .................. H01L 29/6684 |
| 2019/0371942 A1 | 12/2019 | Bossu |
| 2020/0098925 A1* | 3/2020 | Dewey ............. H01L 29/40111 |
| 2020/0098926 A1 | 3/2020 | Sharma |
| 2020/0144293 A1 | 5/2020 | Maj Hi |

* cited by examiner

FERROELECTRIC MEMORY DEVICE

CROSS-REFERENCE TO RELATED APPLICATION

The present application is a divisional application of a U.S. patent application Ser. No. 16/188,290, filed on Nov. 13, 2018, which claims priority under 35 U.S.C. 119(a) to Korean Patent Application No. 10-2018-0030344, filed on Mar. 15, 2018, which is herein incorporated by reference in its entirety.

BACKGROUND

1. Technical Field

Various embodiments of the present disclosure generally relate to a semiconductor device, and more particularly, relate to a ferroelectric memory device.

2. Related Art

Generally, a ferroelectric material means a material having spontaneous electrical polarization in a state in which no external electric field is applied. Specifically, the ferroelectric material can maintain any one of two stable remanent polarization states. Such characteristics can be utilized in memory devices to store logic information of "0" or "1" in a nonvolatile manner.

Meanwhile, since the remanent polarization can be switched by application of an external electric field, studies regarding the application of ferroelectric materials in nonvolatile memory devices have been actively conducted. As an application example, in a cell structure having a single transistor, a nonvolatile memory device can use a ferroelectric material in a gate dielectric layer of the transistor. The gate dielectric layer including the ferroelectric material may store remanent polarization having different polarization orientations depending on the magnitude or polarity of voltage applied from the outside. In addition, the different potential polarization orientations may induce different types of charge into a channel region of the transistor. As a result, a channel resistance of the transistor can be measured to identify the stored remanent polarization.

SUMMARY

There is disclosed a ferroelectric memory device according to one aspect of the present disclosure. The ferroelectric memory device includes a semiconductor substrate, a channel layer disposed on the semiconductor substrate, a ferroelectric layer disposed on the channel layer, and a gate electrode layer disposed on the ferroelectric layer. The channel layer includes an epitaxial film.

There is disclosed a ferroelectric memory device according to another aspect of the present disclosure. The ferroelectric memory device includes a semiconductor substrate, a threshold switching layer disposed on the semiconductor substrate, a ferroelectric layer disposed on the threshold switching layer, and a gate electrode layer disposed on the ferroelectric layer.

There is disclosed a ferroelectric memory device according to yet another aspect of the present disclosure. The ferroelectric memory device includes a semiconductor substrate, a fin structure disposed on the semiconductor substrate and having a trench, a plurality of resistor layers stacked vertically in the trench, each resistor layer having a different electrical resistance, and a gate electrode layer electrically connected to each resistor layer in the plurality of resistor layers. The plurality of resistor layers are disposed between the gate electrode layer and the ferroelectric layer.

DETAILED DESCRIPTION

Figure 1:
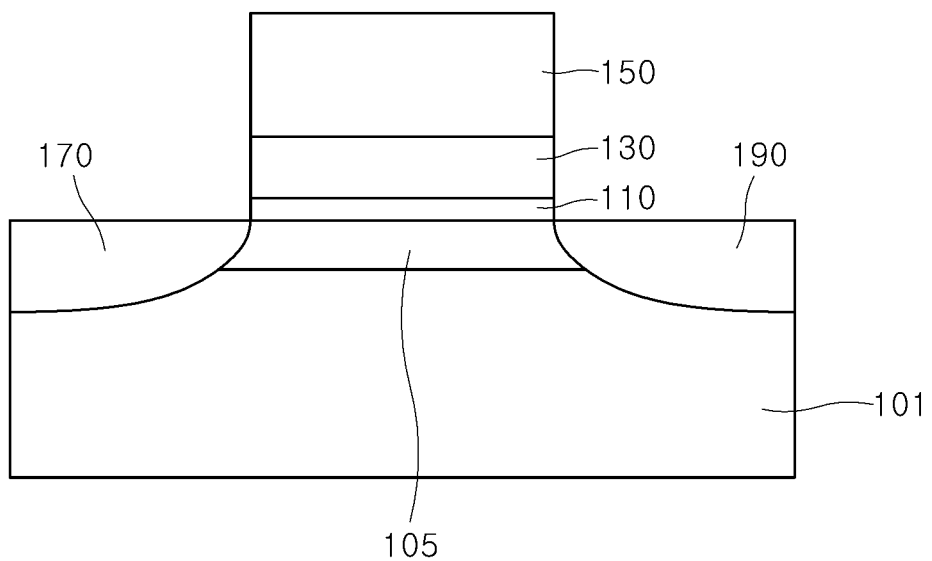
FIG. 1 is a cross-sectional view schematically illustrating a ferroelectric memory device according to a comparative example of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise", "include" or "have" are intended to specify the presence of a feature, a number, a step, an operation, an element, a part, or combinations thereof, but not used to preclude the presence or possibility of addition of one or more other features, numbers, steps, operations, components, parts, or combinations thereof.

FIG. 1 is a cross-sectional view schematically illustrating a ferroelectric memory device 1 according to a comparative example of the present disclosure. Referring to FIG. 1, the ferroelectric memory device 1 may include a substrate 101, an interfacial insulation layer 110, a ferroelectric layer 130 and a gate electrode layer 150. The ferroelectric memory device 1 may be a transistor-type memory device in which different channel resistances are implemented depending on an orientation of a remanent polarization stored in the ferroelectric layer 130.

The ferroelectric device 1 described in this comparative example may perform the following memory writing operation. When a predetermined write voltage is applied through the gate electrode layer 150, polarization having a predetermined polarization orientation may be formed in the ferroelectric layer 130. In addition, even after the write voltage is removed, a remanent polarization having the same orientation as the polarization orientation may be retained and stored in the ferroelectric layer 130. The stored remanent polarization can correspond to a logic information. As an example, the remanent polarization having an orientation from the gate electrode layer 150 toward the substrate 101 may correspond to a logic information of '1', and the remanent polarization having an orientation from the substrate 101 toward the gate electrode layer 150 may correspond to a logic information of '0'.

A read operation of the ferroelectric memory device 1 described in this embodiment may be performed as follows. Initially, the remanent polarization in ferroelectric layer 130 can induce electrons into a channel region 105 of the substrate 101 or can cause holes to eject from the channel region 105, depending on the polarization orientation of the remanent polarization. Thus, in another example, the remanent polarization can induce holes into the channel region 105 of the substrate 101 or can eject electrons from the channel region 105. When a read voltage is applied to the gate electrode layer 150, a channel resistance between a source region 170 and a drain region 190 may vary depending on the type or amount of the charge induced in the channel region 105. As an example, when information of '1' is stored in the ferroelectric layer 130 of an NMOS type ferroelectric memory device 1, electrons may be induced into the channel region 105 by the corresponding remanent polarization. In this case, when a predetermined read voltage is applied, the channel resistance may be relatively low or decreased. As another example, when information of '0' is stored in the ferroelectric layer 130 of the NMOS type ferroelectric memory device 1, electrons may be ejected from the channel region 105 by the corresponding remanent polarization. In this example, when the read voltage is applied, the channel resistance can be relatively high or increased. As such, logic information stored in the ferroelectric memory device 1 can be read out by measuring changes in the channel resistance.

Referring to FIG. 1, the substrate 101 may include, for example, a semiconductor material. As an example, the substrate 101 may be a p-type doped silicon substrate. The source region 170 and the drain region 190 may be disposed in the substrate 101 at both or opposite ends of the gate electrode layer 150. When the substrate 101 is doped into p-type, the source region 170 and the drain region 190 may be regions doped into n-type.

The interfacial insulation layer 110 may be disposed on the substrate 101. The interfacial insulation layer 110 may have an amorphous structure. The interfacial insulation layer 110 may be interposed between the substrate 101 and the ferroelectric layer 130 and function to suppress an interfacial reaction between the substrate 101 and the ferroelectric layer 130 during manufacturing processes. Defect sites that can trap charges may be generated at a direct interface between the substrate 101 and the ferroelectric layer 130 due to the interfacial reaction. As the density of the defect sites increases, the ferroelectric characteristics of the ferroelectric layer 130 may be degraded. The interfacial insulation layer 110 may include, for example, silicon oxide, silicon nitride, or silicon oxynitride.

The ferroelectric layer 130 may be disposed on the interfacial insulation layer 110. The ferroelectric layer 130 may include a crystalline metal oxide. The ferroelectric layer 130 may include, for example, hafnium oxide ($HfO_2$), zirconium oxide ($ZrO_2$), hafnium zirconium oxide ($Hf_{0.5}Zr_{0.5}O_2$), or a combination thereof. The ferroelectric layer 130 may include at least one dopant. As an example, the ferroelectric layer 130 may include carbon (C), silicon (Si), magnesium (Mg), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination thereof, as the dopant.

The gate electrode layer 150 may be disposed on the ferroelectric layer 130. The gate electrode layer 150 may include a conductive material. The gate electrode layer 150 may include, for example, tungsten (W), titanium (Ti), copper (Cu), aluminum (Al), platinum (Pt), iridium (Ir), ruthenium (Ru), tungsten nitride (WN), titanium nitride (TiN), tantalum nitride (TaN), iridium oxide ($IrO_2$), ruthenium oxide ($RuO_2$), tungsten carbide (WC), titanium carbide (TiC), tungsten silicide ($WSi_2$), titanium silicide ($TiSi_2$), tantalum silicide ($TaSi_2$), or a combination of two or more thereof.

Figure 2:
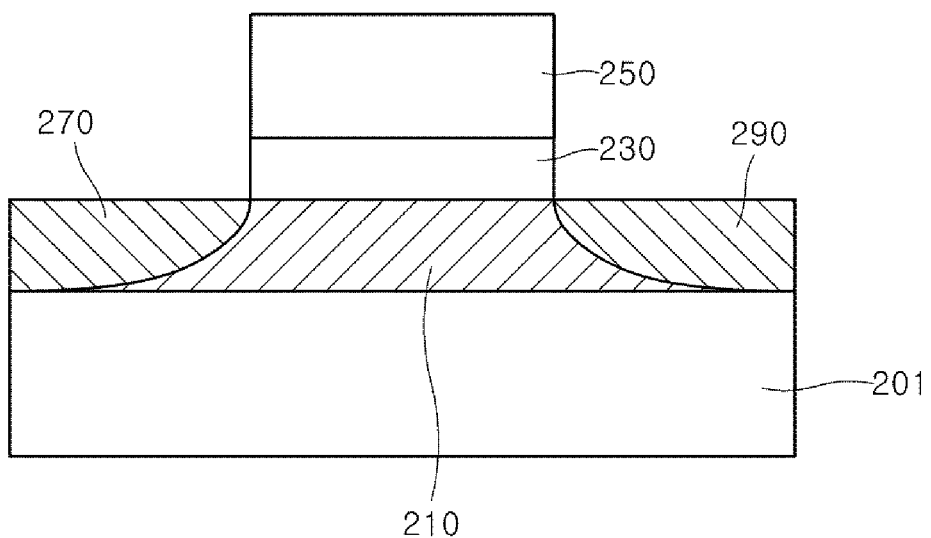
FIG. 2 is a cross-sectional view schematically illustrating a ferroelectric memory device according to an embodiment of the present disclosure.

The above-described ferroelectric memory device of the comparative example may have a relatively degraded structure, performance and function as compared with the ferroelectric memory device of an embodiment according to the following description of FIG. 2. As an example, the interfacial insulation layer 110 may have an amorphous structure, so that a crystal grain size of the ferroelectric layer 130 and an orientation of the polarization axis in the crystal grain can be non-uniformly distributed relative to the substrate 101 when the ferroelectric layer 130 is formed on the interfacial insulation layer 110. As a result, a polarization switching voltage deviation may occur among a plurality of memory cell transistors when the ferroelectric memory device includes a plurality of ferroelectric memory cell transistors.

As another example, the interfacial insulation layer 110 may be interposed between the substrate 101 and the ferroelectric layer 130, so that a voltage drop occurs across the interfacial insulation layer 110 when a write voltage or a read voltage is applied between the gate electrode layer 150 and the substrate 101. Consequently, it is necessary to increase the magnitude of the write voltage or the read voltage to compensate for the voltage drop, thus requiring an increase in the operation voltage of the ferroelectric memory device. In yet another example, when the write voltage or the read voltage applied between the substrate 101 and the ferroelectric layer 130 is increased to compensate for the voltage drop as described above, the interfacial insulation layer 110 may be electrically damaged from the increased write voltage and read voltage. As a result, trap sites of charge may form in the interfacial insulation layer 110 or at the interface between the interfacial insulation layer 110 and the ferroelectric layer 130. The trap sites may be a leakage path for charge to travel between the substrate 101 and ferroelectric layer 130, so that the endurance and reliability of the ferroelectric memory device deteriorates.

FIG. 2 is a cross-sectional view schematically illustrating a ferroelectric memory device 2 according to an embodiment of the present disclosure. Referring to FIG. 2, the ferroelectric memory device 2 may include a semiconductor substrate 201, a channel layer 210, a ferroelectric layer 230 and a gate electrode layer 250. The channel layer 210 may include an epitaxial layer.

The semiconductor substrate 201 may include, for example, a semiconductor material. The semiconductor substrate 201 may be, for example, a silicon (Si) substrate, a gallium arsenide (GaAs) substrate, an indium phosphide (InP) substrate, a germanium (Ge) substrate, or a silicon germanium (SiGe) substrate. At least a region of the semiconductor substrate 201 may be doped with a dopant. As an example, the semiconductor substrate 201 may be doped into an n-type or a p-type substrate.

Meanwhile, a source region 270 and a drain region 290 may be disposed in the semiconductor substrate 201. The source region 270 and the drain region 290 may be positioned in the semiconductor substrate 201 at both ends of the gate electrode layer 250. The source region 270 and the drain region 290 may contact the channel layer 210. In an embodiment, when the semiconductor substrate 201 is doped into p-type, the source region 270 and the drain region 290 may both be regions doped into n-type. Alternatively, when the semiconductor substrate 201 is doped into n-type, the source region 270 and a drain region 290 may both be regions doped into p-type.

The channel layer 210 may be disposed on the semiconductor substrate 201. As an example, the channel layer 210 may have a thickness of five nanometers (5 nm) to twenty nanometers (20 nm). In an embodiment, the channel layer 210 may have a crystalline structure. As an example, the channel layer 210 may have a single crystalline structure.

The channel layer 210 may have an epitaxial film at or near the interface with ferroelectric layer 230. The epitaxial film may have low reaction efficiency with oxygen. That is, when the ferroelectric layer 230 includes metal oxide, the channel layer 210 may not react with the metal oxide. Accordingly, the channel layer 210 can form a stable interface with the ferroelectric layer 230. In an embodiment, the epitaxial film may include a Group 4 element such as carbon (C) or germanium (Ge). In an embodiment, when the semiconductor substrate 201 includes silicon (Si), the epitaxial film may include silicon carbide (SiC) or silicon germanium (SiGe). When the epitaxial film includes silicon carbide (SiC) or silicon germanium (SiGe), carbon (C) or germanium (Ge) may exist as a substitutional element in silicon (Si). Depending on the amount of carbon (C) or germanium (Ge), the degree of lattice strain of silicon carbide (SiC) or silicon germanium (SiGe) may vary. That is, the lattice size of silicon carbide (SiC) or silicon germanium (SiGe) can be controlled by controlling the amount of carbon (C) or germanium (Ge) provided for forming silicon carbide (SiC) or silicon germanium (SiGe).

In addition, when the ferroelectric layer 230 is bonded to the epitaxial film including the silicon carbide (SiC) or silicon germanium (SiGe) with controlled lattice size, the epitaxial film may induce lattice strain in the ferroelectric layer 230. The lattice strain of the ferroelectric layer 230 may form an electric field in the ferroelectric layer 230 by a flexoelectric effect. The flexoelectric effect can stabilize the ferroelectric characteristics of the ferroelectric layer 230. In the ferroelectric layer 230, stabilization of ferroelectric characteristics may mean suppressing or preventing the ferroelectric characteristics of the ferroelectric layer 230 from being changed to other dielectric characteristics such as paraelectric characteristics, or stabilization may mean assisting the ferroelectric layer 230 to maintain uniform ferroelectricity.

In an embodiment, the epitaxial film includes a silicon carbide (SiC) film, and various degrees of lattice strain may be generated in the ferroelectric layer 230 in contact with the epitaxial film by controlling the carbon content in the silicon carbide (SiC) film. The lattice strain may include tensile strain or compressive strain. At this time, the carbon (C) in the silicon carbide (SiC) film may form a concentration gradient along the thickness direction of the silicon carbide (SiC) film. In an alternative example, the carbon (C) in the silicon carbide (SiC) film may have a uniform concentration along the thickness direction of the silicon carbide (SiC) film.

In another embodiment, the epitaxial film includes a silicon germanium (SiGe) thin film, and various degrees of lattice strain may be generated in the ferroelectric layer 230 in contact with the epitaxial thin film by controlling the germanium content in the silicon germanium (SiGe) thin film. The lattice strain may include tensile strain or compressive strain. At this time, germanium (Ge) in the silicon germanium (SiGe) thin film may form a concentration gradient along the thickness direction of the silicon germanium (SiGe) thin film. In a different example, germanium (Ge) in the silicon germanium (SiGe) thin film may have the same concentration along the thickness direction of the silicon germanium (SiGe) thin film.

The channel layer 210 may be doped with a dopant to have properties consistent with a semiconductor. The type of the dopant may be the same as the doping type used in the semiconductor substrate 201. That is, when the semiconductor substrate 201 is doped into p-type, the channel layer 210 may also be doped into a p-type. The channel layer 210 may include boron (B) or aluminum (Al) as examples of p-type dopants. When the semiconductor substrate 201 is doped into n-type, the channel layer 210 may be doped into n-type. The channel layer 210 may include phosphorus (P) or arsenide (As) as examples of n-type dopants. In an embodiment, an upper surface of the channel layer 210 may include carbon (C) or germanium (Ge) among the compounds making up the epitaxial film. That is, elemental carbon (C) or elemental germanium (Ge) may be located at or included in the surface of the channel layer 210. Accordingly, the ferroelectric layer 230 can come into direct contact with carbon (C) or germanium (Ge) in the epitaxial film.

The ferroelectric layer 230 may be disposed on the channel layer 210. The ferroelectric layer 230 may include a crystalline metal oxide. As an example, the ferroelectric layer 230 may include hafnium oxide ($HfO_2$), zirconium oxide ($ZrO_2$), hafnium zirconium oxide ($Hf_{0.5}Zr_{0.5}O_2$), $Pb(Zr, Ti)O_3$, $SrBi_2Ta_2O_9$($Bi, La)_4Ti_3O_{12}$, $BiFeO_3$, or a combination of two or more thereof.

In an embodiment, the ferroelectric layer 230 may include at least one dopant. The dopant can help stabilize the ferroelectricity of the ferroelectric layer 230. As an example, the ferroelectric layer 230 may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination thereof.

The gate electrode layer 250 may be disposed on the ferroelectric layer 230. The gate electrode layer 250 may include a conductive material. The gate electrode layer 250 may include, for example, tungsten (W), titanium (Ti), copper (Cu), aluminum (Al), platinum (Pt), iridium (Ir), ruthenium (Ru), tungsten nitride (WN), titanium nitride (TiN), tantalum nitride (TaN), iridium oxide ($IrO_2$), ruthenium oxide ($RuO_2$), tungsten carbide (WC), titanium carbide (TiC), tungsten silicide ($WSi_2$), titanium silicide ($TiSi_2$), tantalum silicide ($TaSi_2$), or a combination of two or more thereof.

As described above, according to an embodiment of the present disclosure, the ferroelectric memory device 2 may include a channel layer 210 having an epitaxial film at or near the interface of ferroelectric layer 230. The epitaxial film may include carbon (C) or germanium (Ge) having low reaction efficiency with oxygen, so that the channel layer 210 can form a stable interface with the ferroelectric layer 230. As compared with the comparative example, embodiments of the present disclosure may omit the interfacial insulation layer disposed between the channel layer 210 and the ferroelectric layer 230.

According to an embodiment, the ferroelectric layer 230 can be induced to have a crystalline structure by disposing the ferroelectric layer 230 on the epitaxial film of channel layer 210. As a result, the grain uniformity of the ferroelectric layer 230 can be improved. Thus, when the ferroelectric memory device 2 has a plurality of ferroelectric memory cell transistors and polarization switching operations are performed in the plurality of memory cell transistors, the polarization switching operation uniformity and reliability among the plurality of memory cell transistors is improved. In addition, the interfacial insulation layer 110 between the channel region 105 and the ferroelectric layer 130 of the comparative example can be omitted. As a result, in embodiments of the present disclosure, ferroelectric memory cell transistors avoid a phenomenon in which the write voltage and the read voltage rises to overcome the voltage drop across the interfacial insulation layer, as well as avoid the formation of trap sites in the interfacial insulation layer, which facilitates a leakage current. In these and other ways, embodiments of the present disclosure improve the durability and reliability of the ferroelectric memory device 2 during the operations of the device.

Figure 3A:
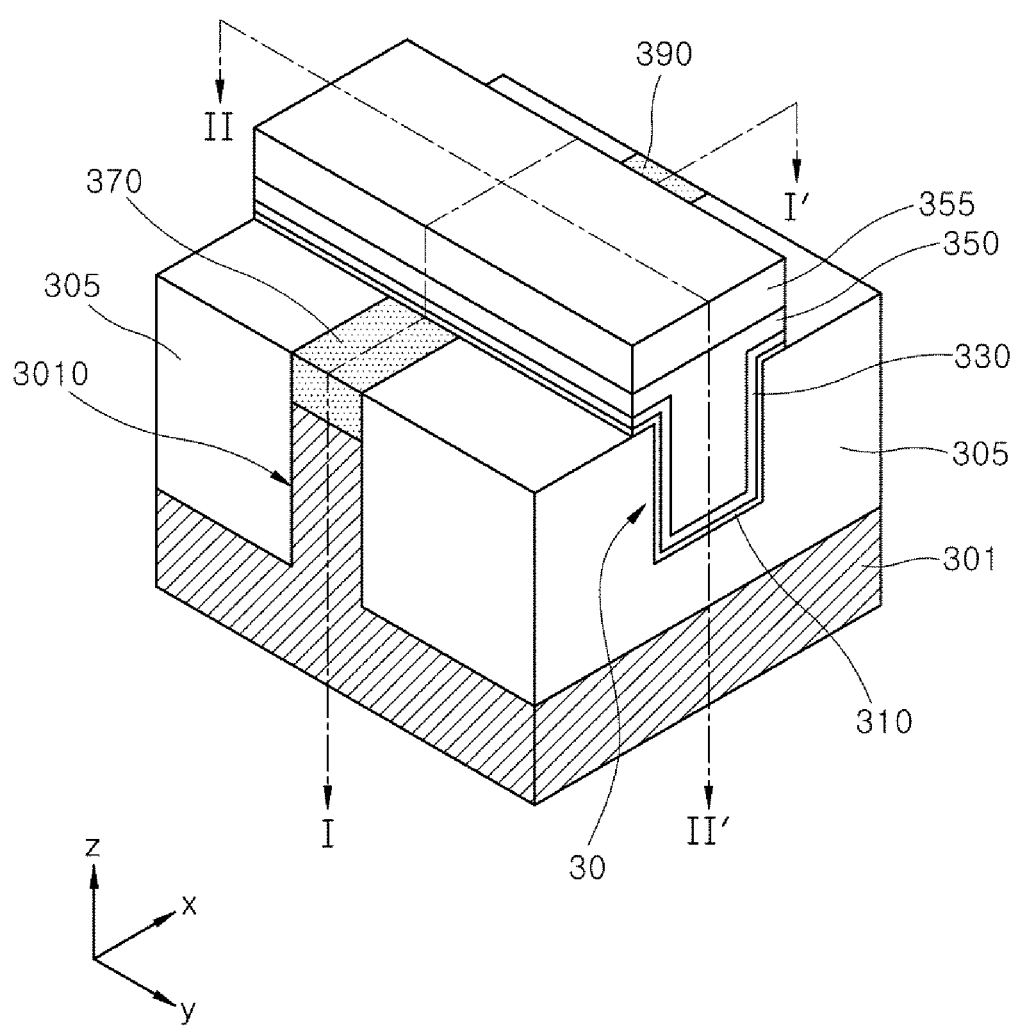
FIGS. 3A to 3C are views schematically illustrating a three-dimensional ferroelectric memory device according to an embodiment of the present disclosure.
Figure 3B:
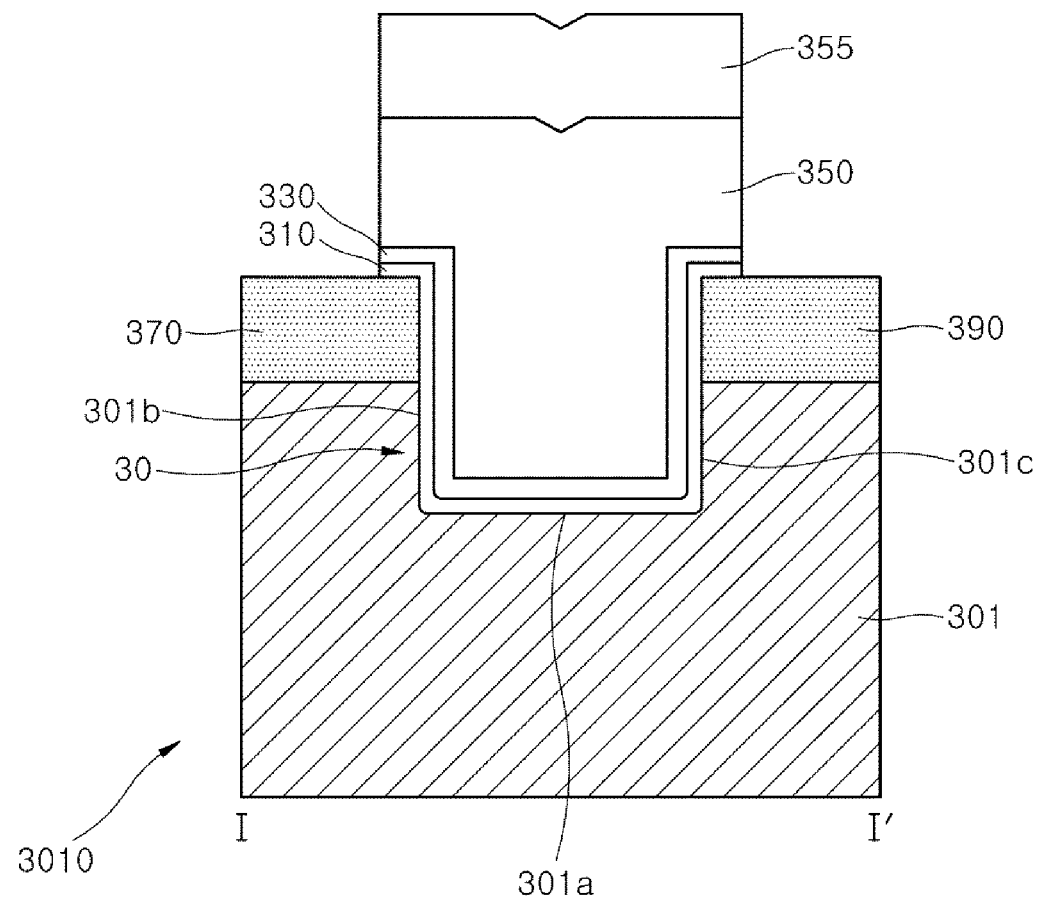
Figure 3C:
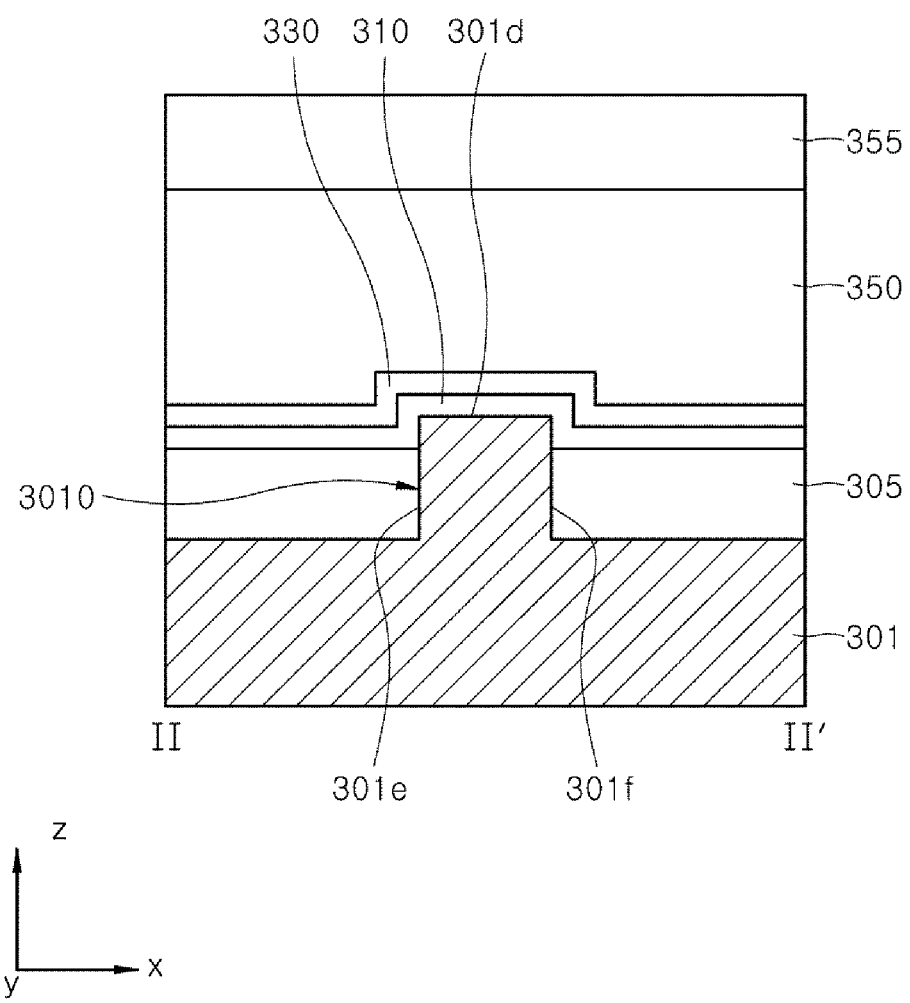

FIGS. 3A to 3C are views schematically illustrating a three-dimensional ferroelectric memory device 3 according to an embodiment of the present disclosure. Although FIGS. 3A to 3C are described with reference to an orthogonal xyz axis system for convenience, it should be apparent that other non-orthogonal axes may be used. Specifically, FIG. 3A is a perspective view of the ferroelectric memory device 3, FIG. 3B is a cross-sectional view taken along line I-I' of the ferroelectric memory device 3 in FIG. 3A, and FIG. 3C is a cross-sectional view taken along line II-II' of the ferroelectric memory device 3 in FIG. 3A. The ferroelectric memory device 3 illustrated in FIGS. 3A to 3C may be a three-dimensional transistor device having a saddle-type channel structure. The channel structure may be implemented in a form of a fin. According to an embodiment, the channel layer 210 described above and with reference to FIG. 2 may be used in the embodiment described with reference to FIGS. 3A to 3C.

Referring to FIGS. 3A to 3C, a semiconductor substrate 301 may be provided. The semiconductor substrate 301 may have a fin structure 3010 disposed to protrude upward. The semiconductor substrate 301 may, for example, have substantially the same configuration as the substrate 201 of an embodiment described above and with reference to FIG. 2. In an embodiment, the semiconductor substrate 301 may be a doped single crystalline silicon (Si) substrate. In an embodiment, the fin structure 3010 may be formed of the same material as the semiconductor substrate 301.

Referring to FIGS. 3A and 3C, an interlayer insulation layer 305 surrounding the fin structure 3010 may be disposed on the semiconductor substrate 301. The interlayer insulation layer 305 may include, for example, silicon oxide, silicon nitride, silicon oxynitride, aluminum nitride, aluminum oxide or a combination of two or more thereof.

Referring to FIGS. 3A and 3B, the fin structure 3010 may have a trench 30. The trench 30 may have a bottom surface 301a extending in the x-direction and the y-direction and sidewall surfaces 301b and 301c extending in the y-direction and the z-direction. A channel layer 310 may be disposed on the bottom surface 301a and the sidewall surfaces 301b and 301c of the trench 30. A ferroelectric layer 330 may be disposed on the channel layer 310. Referring to FIGS. 3A and 3C, the channel layer 310 may be disposed on at least a portion of an upper surface 301d and side surfaces 301e and 301f of the fin structure 3010 and an upper surface of the interlayer insulation layer 305. The ferroelectric layer 330 may be also disposed on the channel layer 310. The configurations of the channel layer 310 and the ferroelectric layer 330 may be substantially the same as those of the channel layer 210 and the ferroelectric layer 230 described above and with reference to FIG. 2.

Meanwhile, referring to FIG. 3B, a gate electrode layer 350 may be disposed on the ferroelectric layer 330. The ferroelectric layer may be disposed on the channel layer 310, which in turn may be disposed on the inner wall surfaces 301a, 301b and 301c of the trench 30. An upper conductive layer 355 may be disposed on the gate electrode layer 350. Referring to FIG. 3C, the gate electrode layer 350 and the upper conductive layer 355 may be sequentially arranged on the ferroelectric layer 330. The gate electrode layer 350 and the upper conductive layer 355 may include a conductive material. The gate electrode layer 350 and the upper conductive layer 355 may include, for example, tungsten (W), titanium (Ti), copper (Cu), aluminum (Al), ruthenium (Ru), platinum (Pt), iridium (Ir), iridium oxide ($IrO_2$), tungsten nitride (WN), titanium nitride (TiN), tantalum nitride (TaN), tungsten carbide (WC), titanium carbide (TiC), tungsten silicide ($WSi_2$), titanium silicide ($TiSi_2$), tantalum silicide ($TaSi_2$), ruthenium oxide ($RuO_2$), or a combination of two or more thereof.

Referring to FIGS. 3A and 3B, a source region 370 and a drain region 390 may be respectively disposed in the fin structure 3010 at opposite to each other with respect to the trench 30. The source region 370 and the drain region 390 may be doped with a type of dopant different from the dopant used in the fin structure 3010. As an example, when the fin structure 3010 is doped into p-type, the source region 370 and the drain region 390 may both be doped into n-type. As another example, when the fin structure 3010 is doped into n-type, the source region 370 and the drain region 390 may both be doped into p-type.

As described above, the configuration of the ferroelectric memory device 2 of the embodiment described above and with reference to FIG. 2 can be realized in a three-dimensional structure. Specifically, the ferroelectric memory device 3 may include the channel layer 310 disposed between the fin structure 3010 and the ferroelectric layer 330. As described above, the channel layer 310 has an epitaxial layer with a low reaction efficiency with oxygen, so that it can form a stable interface with the ferroelectric layer 330. Accordingly, the interfacial insulation layer between the channel region 105 and the ferroelectric layer 130 of the comparative example can be omitted. As a result, in the operation of the ferroelectric memory device 3, a phenomenon in which the write voltage and the read voltage rises or increases to overcome the voltage drop across the interfacial insulation layer in derogation of the device is avoided. In addition, the formation of trap sites in the interfacial insulation layer that facilitate a leakage current can also be avoided in ferroelectric memory device 3.

In addition, since the channel layer 310 has a crystalline structure, the ferroelectric layer 330 formed on the channel layer 310 can have uniform grains. Accordingly, when the ferroelectric memory device 3 has a plurality of ferroelectric memory cell transistors, and the polarization switching operations are performed in the plurality of memory cell transistors, the polarization switching operation uniformity and repeatability between the plurality of memory cell transistors is improved.

Figure 4:
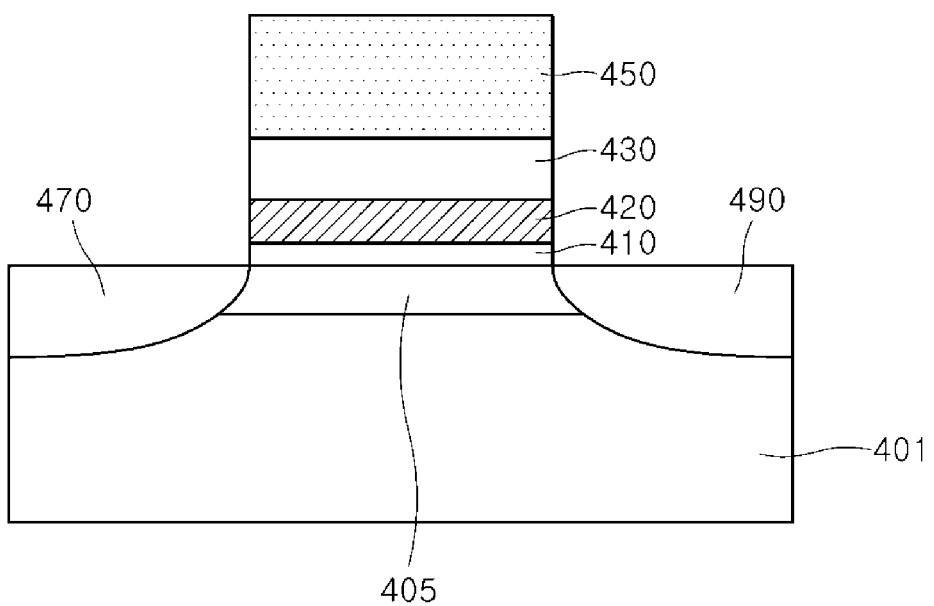
FIG. 4 is a cross-sectional view schematically illustrating a ferroelectric memory device according to an embodiment of the present disclosure.

FIG. 4 is a cross-sectional view schematically illustrating a ferroelectric memory device 4 according to an embodiment of the present disclosure. Referring to FIG. 4, the ferroelectric memory device 4 may include a semiconductor substrate 401, an interfacial insulation layer 410, a threshold switching layer 420, a ferroelectric layer 430 and a gate electrode layer 450. The threshold switching layer 420 can control the voltage supplied to the ferroelectric layer 430 based on a predetermined threshold voltage.

The semiconductor substrate 401 may include, for example, a semiconductor material. The semiconductor substrate 401 may be, for example, a silicon (Si) substrate, a gallium arsenide (GaAs) substrate, an indium phosphide (InP) substrate, a germanium (Ge) substrate, or a silicon germanium (SiGe) substrate. At least a region of the semiconductor substrate 401 may be doped with a dopant. As an example, the semiconductor substrate 401 may be doped into an n-type or a p-type substrate. A source region 470 and a drain region 490 may be disposed in the semiconductor substrate 401 at both or opposite ends of the gate electrode layer 450. In an embodiment, when the semiconductor substrate 401 is doped into p-type, the source region 470 and the drain region 490 may both be regions doped into n-type. In another embodiment, when the semiconductor substrate 401 is doped into n-type, the source region 470 and a drain region 490 may both be regions doped into p-type. A channel region 405 may be positioned in the semiconductor substrate 401 between the source region 470 and the drain region 490. Depending on the orientation of remanent polarization stored in the ferroelectric layer 430, charge may be induced into the channel region 405 or the charge may be ejected from the channel region 405 under the influence of the remanent polarization.

The interfacial insulation layer 410 may be disposed on the semiconductor substrate 401. The interfacial insulation layer 410 may be interposed between the semiconductor substrate 401 and the threshold switching layer 420 to suppress interfacial reaction between the substrate 401 and the threshold switching layer 420 during a manufacturing process. Due to the interfacial reaction, defect sites capable of trapping charges can be generated at an interface between the semiconductor substrate 401 and the threshold switching layer 420 and, as the density of the defect sites increases, the switching performance may be degraded. In an embodiment, when the semiconductor substrate 401 includes silicon (Si), the interfacial insulation layer 410 may include, for example, silicon oxide, silicon nitride, or silicon oxynitride. In some embodiments, when the semiconductor substrate 401 and the threshold switching layer 420 form a chemically stable interface, the interfacial insulation layer 410 may be omitted. In such instances, the threshold switching layer 420 may be directly disposed on the semiconductor substrate 401.

Referring to FIG. 4, the threshold switching layer 420 may be disposed on the interfacial insulation layer 410. The threshold switching layer 420 can perform or control a threshold switching operation in response to an externally applied voltage. The threshold switching operation is an operation in which the threshold switching layer 420 can have an electrical turn-on state or an electrical turn-off state, based on a predetermined threshold voltage, depending on the external voltage applied to the threshold switching layer 420. The electrical turn-on state can be generated by non-linearly or rapidly increasing an operation current flowing in the threshold switching layer 420 to a predetermined first threshold voltage or higher, when an absolute value of the external voltage applied to the threshold switching layer 420 is continuously increased from an initial turn-off state. Next, when the absolute value of the external voltage applied to the threshold switching layer 420 is continuously decreased while the threshold switching layer 420 is in the electrical turn-on state, the operation current is nonlinearly or rapidly decreased to a predetermined second threshold voltage or lower, at which point the turn-off state is implemented in the threshold switching layer.

Whether an external voltage is provided to the ferroelectric layer 430 depends on the turn-on state or the turn-off state of the threshold switching layer 420. As an example, when the threshold switching layer 420 is in the turn-on state, the externally applied voltage can be transmitted to the ferroelectric layer 430. On the other hand, when the threshold switching layer 420 is in the turn-off state, the externally applied voltage is not or cannot be sufficiently transmitted to the ferroelectric layer 430. In an embodiment, when a write operation or a read operation of the ferroelectric memory device 4 is performed, the first and second threshold voltages of the threshold switching layer 420 may be lower than a polarization switching voltage of the ferroelectric layer 430. The polarization switching voltage is a sufficiently high operation voltage at which point the polarization orientation of the ferroelectric layer 430 can be switched.

The threshold switching layer 420 may include, for example, silicon oxide, silicon nitride, aluminum oxide, zirconium oxide, hafnium oxide, tungsten oxide, titanium oxide, nickel oxide, copper oxide, manganese oxide, tantalum oxide, niobium oxide, iron oxide or a combination of two or more thereof. The threshold switching layer 420 may have trap sites for trapping charges such as electrons or holes therein. In an embodiment, the threshold switching layer 420 may include a dopant. As an example, the threshold switching layer 420 may include, as the dopant, aluminum (Al), lanthanum (La), niobium (Nb), vanadium (V), tantalum (Ta), tungsten (W), chromium (Cr), molybdenum (Mo), copper (Cu), zirconium (Zr), hafnium (Hf), titanium (Ti), nickel (Ni), or a combination of two or more thereof. The dopant can increase the density of the trap sites that trap the charges in the threshold switching layer 420.

In an embodiment, a charge trapped by a trap site in the threshold switching layer 420 can be suppressed or prevented from moving to another trap site when a voltage equal to or lower than a predetermined threshold voltage, such as the first or second threshold voltage, is applied. When a voltage equal to or higher than the threshold voltage is applied, the charge trapped by the trap site can move to another trap site along an electric field formed in the threshold switching layer 420. The resistance inside the threshold switching layer 420 is reduced by the movement of the charge, so that the switching operation of the threshold switching layer 420 is facilitated.

Referring again to FIG. 4, the ferroelectric layer 430 may be disposed on the threshold switching layer 420. The ferroelectric layer 430 may include crystalline metal oxide. The ferroelectric layer 430 may include, for example, hafnium oxide ($HfO_2$), zirconium oxide ($ZrO_2$), hafnium zirconium oxide ($Hf_{0.5}Zr_{0.5}O_2$), $Pb(Zr, Ti)O_3$, $SrBi_2Ta_2O_9$($Bi, La)_4Ti_3O_{12}$, $BiFeO_3$, or a combination of two or more thereof.

In an embodiment, the ferroelectric layer 430 may include at least one dopant. The dopant can help stabilize the ferroelectricity of the ferroelectric layer 430. As an example, the ferroelectric layer 430 may include, as the dopant, carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination thereof.

The gate electrode layer 450 may be disposed on the ferroelectric layer 430. The gate electrode layer 450 may include a conductive material. The gate electrode layer 450 may include, for example, tungsten (W), titanium (Ti), copper (Cu), aluminum (Al), platinum (Pt), iridium (Ir), ruthenium (Ru), tungsten nitride (WN), titanium nitride (TiN), tantalum nitride (TaN), iridium oxide ($IrO_2$), ruthenium oxide ($RuO_2$), tungsten carbide (WC), titanium carbide (TiC), tungsten silicide ($WSi_2$), titanium silicide ($TiSi_2$), tantalum silicide ($TaSi_2$), or a combination of two or more thereof.

Figure 5A:
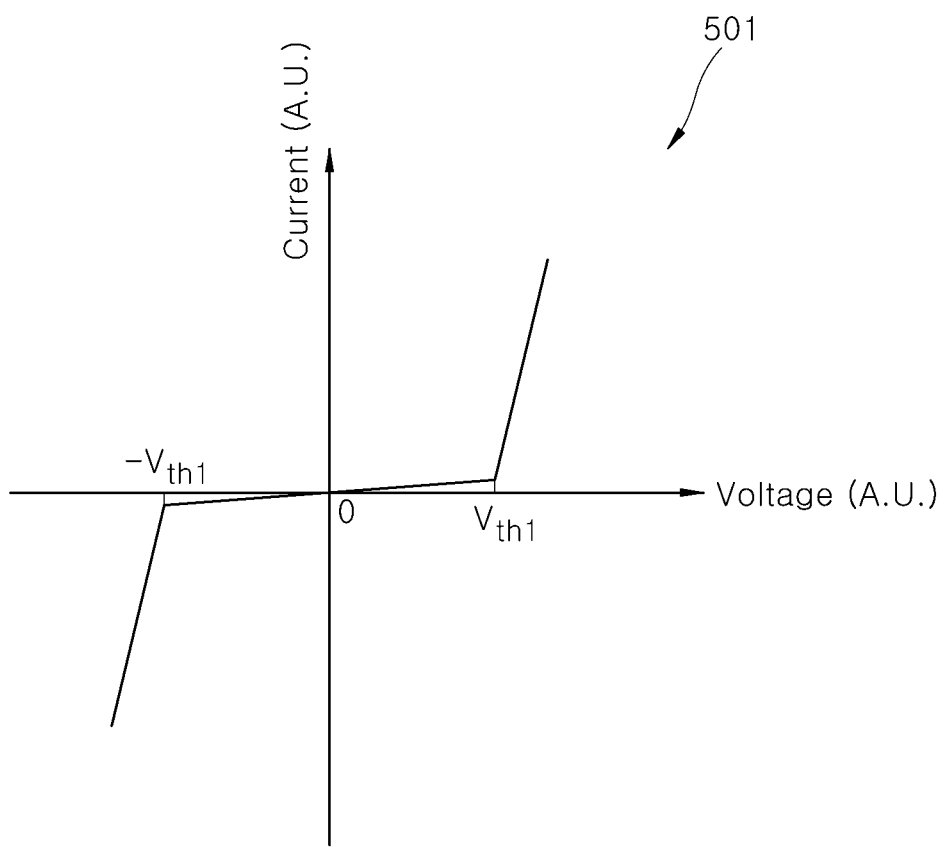
FIGS. 5A to 5C are views schematically illustrating an operation method of a ferroelectric memory device according to an embodiment of the present disclosure.
Figure 5B:
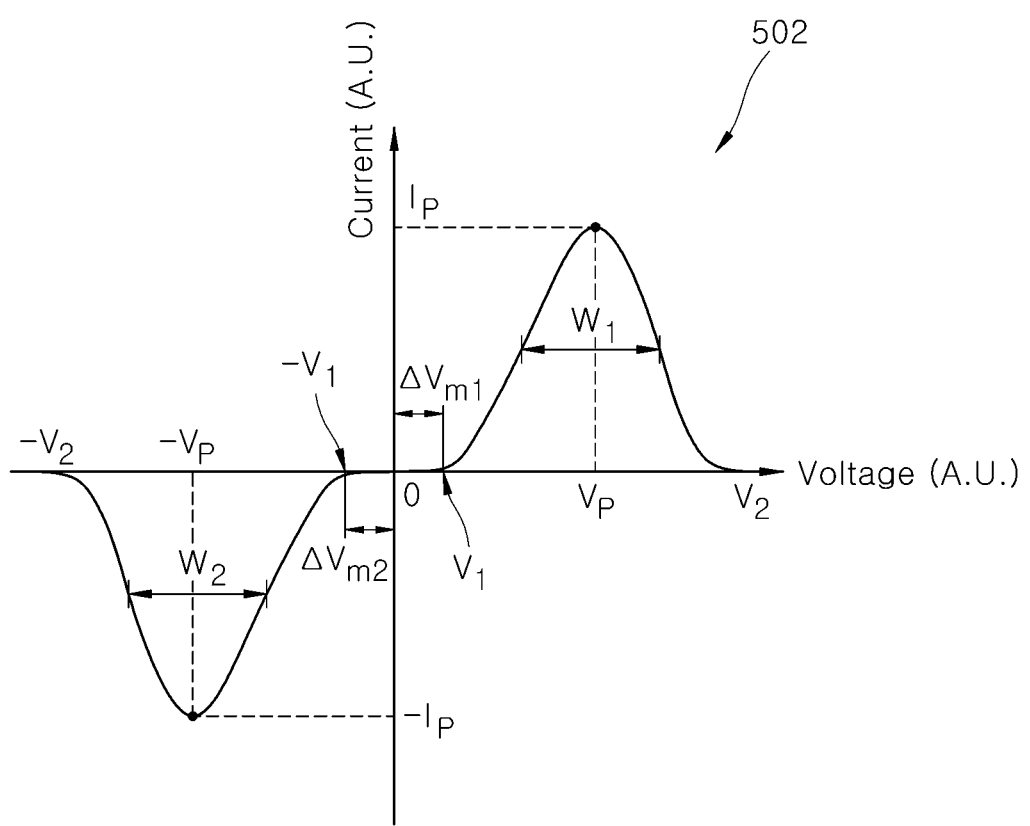
Figure 5C:
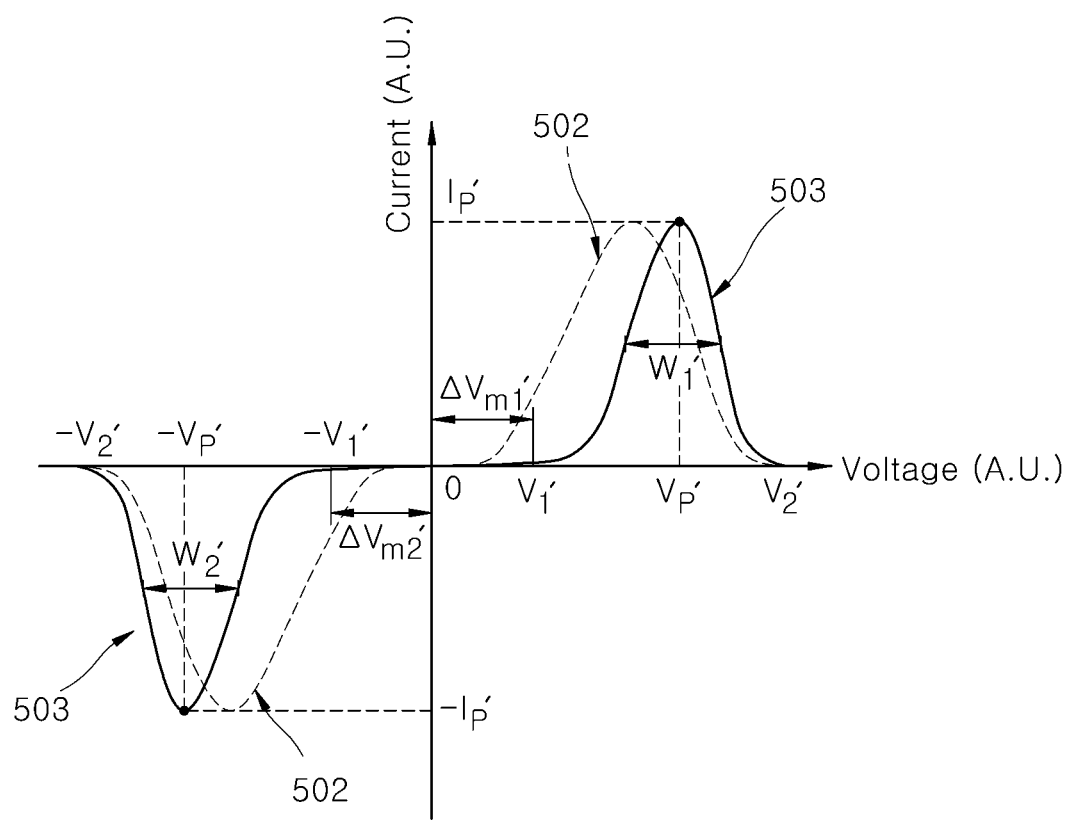

FIGS. 5A to 5C are views schematically illustrating an operation method of a ferroelectric memory device according to an embodiment of the present disclosure. FIG. 5A is a view explaining an operation when an external voltage is applied to the threshold switching layer 420 of the ferroelectric memory device 4 described above and with reference to FIG. 4. FIG. 5B is a view explaining an operation when an external voltage is applied to the ferroelectric layer 430 of the ferroelectric memory device 4 in the absence of a threshold switching layer 420. FIG. 5C is a view explaining a distribution of a polarization switching current when an external voltage is applied to the ferroelectric memory device 4 when the threshold switching layer 420 and the ferroelectric layer 430 are connected in series.

Referring to FIG. 5A, when a voltage is applied to both ends of the threshold switching layer 420 while sweeping, a characteristic of the output current with respect to the input voltage is shown in graph 501. That is, when the external voltage having a positive polarity is increased to a first threshold voltage $V_{th1}$ or higher, the threshold switching layer 420 may be electrically turned on, and when an absolute value of the external voltage having a negative polarity is increased to an absolute value of a second threshold voltage $-V_{th1}$ or higher, the threshold switching layer 420 may be electrically turned on. The current flowing in the threshold switching layer 420 may vary rapidly depending on the variation of the applied voltage with reference to the first and second threshold voltages $V_{th1}$ and $-V_{th1}$.

Referring to FIG. 5B, the distribution of the polarization switching current depending on the voltage applied to the ferroelectric layer 430 is shown in graph 502. The polarization switching current is a current flowing in the ferroelectric layer 430 when a polarization switching operation is performed in the ferroelectric layer 430 in response to the application of a voltage. Referring to graph 502, when a positive voltage is applied to the ferroelectric layer 430, the polarization switching operation may occur in a voltage range between a first voltage $V_1$ and a second voltage $V_2$. Meanwhile, when a negative voltage is applied to the ferroelectric layer 430, the polarization switching operation may occur in a voltage range between a third voltage $-V_1$ and a fourth voltage $-V_2$. However, the polarization switching current may exhibit first and second peak currents $I_p$ and $-I_p$, which are the maximum values, when the applied voltage is at first and second peak voltages $V_p$ and $-V_p$, respectively. That is, when the applied voltage is the first and second peak voltages $V_p$ and $-V_p$, respectively, polarization switching can occur in the ferroelectric layer 430 to the greatest degree. In addition, the polarization switching current may exhibit a distribution having a predetermined full width at half maximum (FWHM) $W_1$ and $W_2$, respectively, as illustrated in the graph 502.

Meanwhile, referring again to FIG. 5B, there is illustrated voltage differences $\Delta V_{m1}$ and $\Delta V_{m2}$ between a state where no voltage is applied and the first and third voltages $V_1$ and $-V_1$, which are the lower limit values of the voltages at which the polarization switching occurs, respectively. As the voltage differences $\Delta V_{m1}$ and $\Delta V_{m2}$ are decreased, the polarization switching operation occurs at a lower applied voltage, so that the operation reliability of the ferroelectric memory device 4 is degraded.

Referring to FIG. 5C, the ferroelectric memory device 4 in which the threshold switching layer 420 and the ferroelectric layer 430 are connected in series, the distribution of the polarization switching current depending on the applied voltage may follow graph 503. Referring to graph 503, when a positive voltage is applied to the ferroelectric layer 430, the polarization switching operation may occur in a voltage range between a first voltage $V_1'$ and a second voltage $V_2'$. Meanwhile, when a negative voltage is applied, the polarization switching operation may occur in a voltage range between a third voltage $-V_1'$ and a fourth voltage $-V_2'$. However, the polarization switching current may exhibit first and second peak currents $I_p'$ and $-I_p'$, which are the maximum values, when the applied voltage is first and second peak voltages $V_p'$ and $-V_p'$, respectively. In addition, the polarization switching current may exhibit the distribution having a predetermined full width at half maximum (FWHM) $W_1'$ and $W_2'$, respectively, as illustrated in the graph 503.

When comparing the graph 503 of FIG. 5C and the graph 502 of FIG. 5B with each other, voltage differences $\Delta V_{m1}'$ and $\Delta V_{m2}'$ between a state where there is no voltage applied and the first and third voltages V1' and V3', which are the lower limits of the voltages at which the polarization is generated, is greater than the voltage differences $\Delta V_{m1}$ and $\Delta V_{m2}$ of FIG. 5B, where the threshold switching layer 420 is omitted. Accordingly, in a case of the ferroelectric memory device 4 in which the threshold switching layer 420 and the ferroelectric layer 430 are connected in series, the polarization switching operation may be performed at a relatively higher application voltage, so that the operation reliability of the ferroelectric memory device 4 can be relatively improved.

In addition, when a voltage equal to or lower than a predetermined threshold voltage is applied to the threshold switching layer 420, the threshold switching layer 420 maintains an electrical turn-off state so that the external voltage is not provided to the ferroelectric layer 430. That is, the external voltage can be applied to the ferroelectric layer 430 only when the threshold switching layer 420 is in the electrical turn-on state. Accordingly, the voltage range in which the polarization switching operation occurs in the ferroelectric layer 430 can be relatively narrowed. That is, full width at half maximum (FWHM) $W_1'$ and $W_2'$ of graph 503 may be smaller than the full width at half maximum (FWHM) $W_1$ and $W_2$ of graph 502. As a result, the polarization switching operation of the ferroelectric memory device 4 may be performed within a more uniform voltage range, so that the operation reliability can be improved.

Figure 6A:
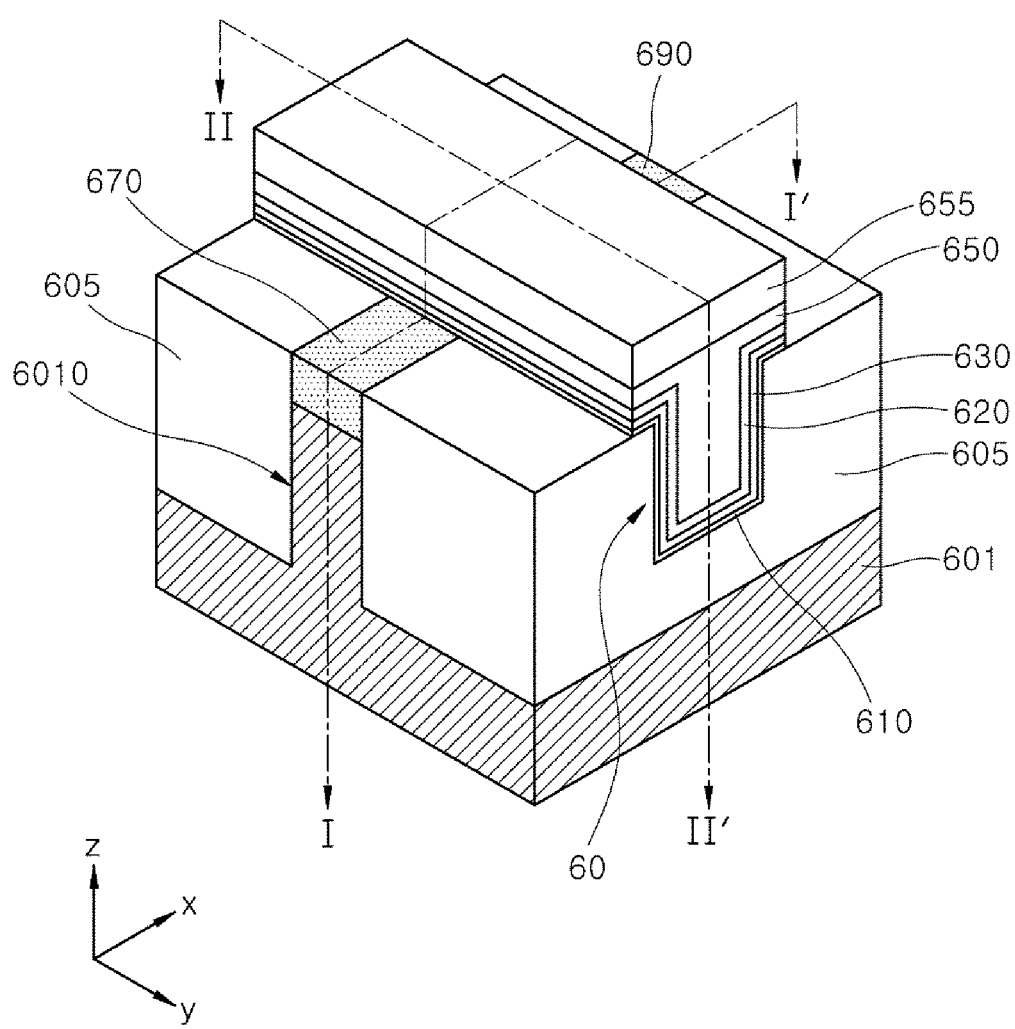
FIGS. 6A to 6C are views schematically illustrating a three-dimensional ferroelectric memory device according to an embodiment of the present disclosure.
Figure 6B:
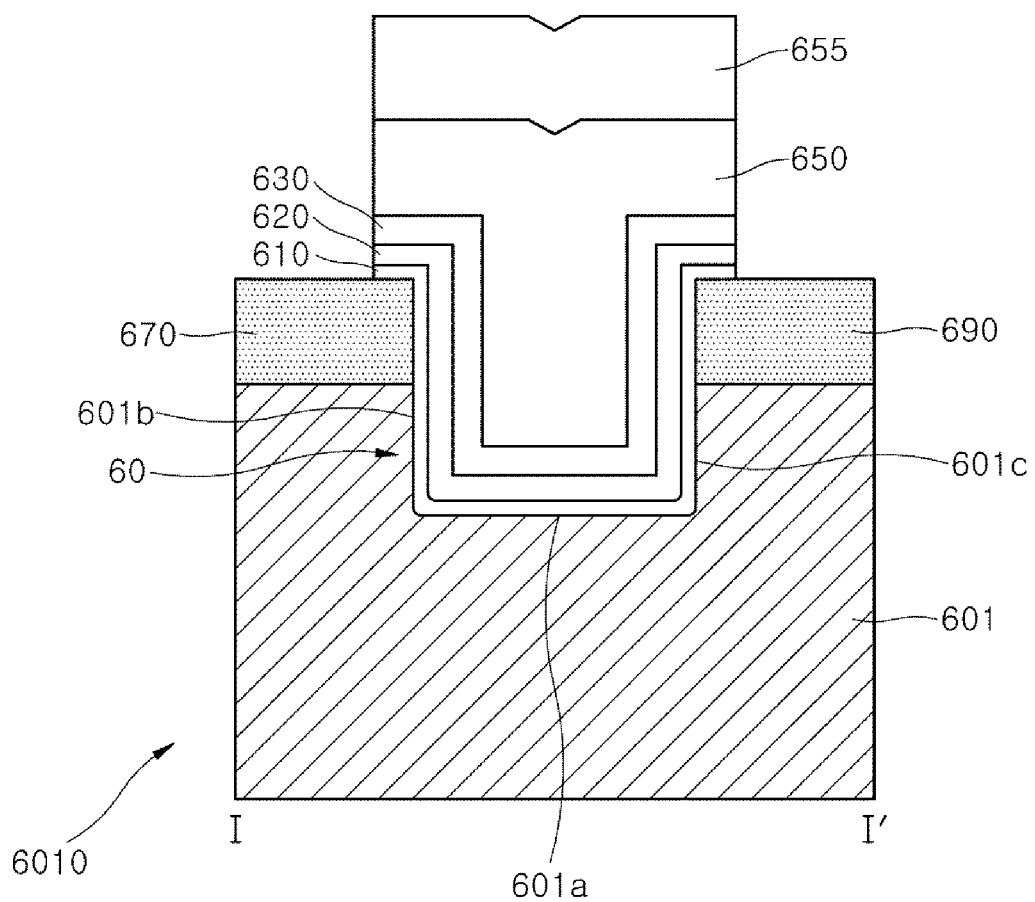
Figure 6C:
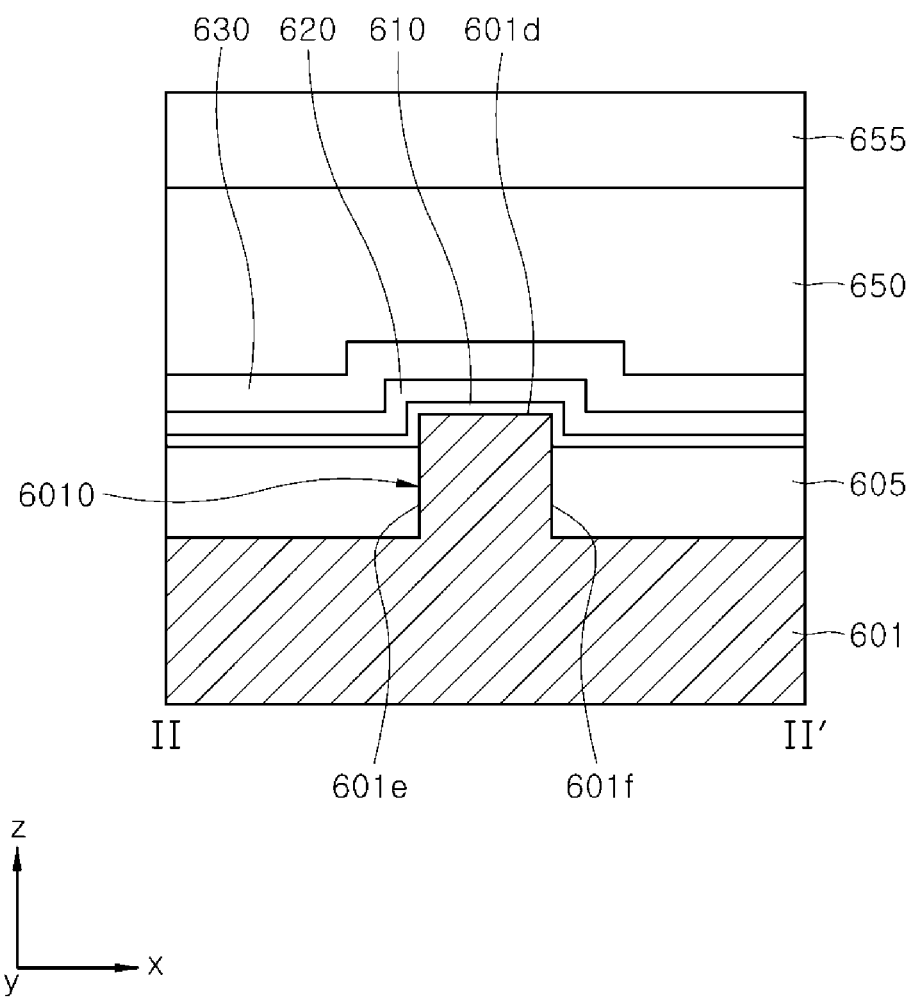

FIGS. 6A to 6C are views schematically illustrating a three-dimensional ferroelectric memory device 6 according to an embodiment of the present disclosure. Although FIGS. 6A to 6C are described with reference to an orthogonal xyz axis system for convenience, it should be apparent that other non-orthogonal axes may be used. Specifically, FIG. 6A is a perspective view of the ferroelectric memory device 6, FIG.

6B is a cross-sectional view taken along line I-I' of the ferroelectric memory device 6 in FIG. 6A, and FIG. 6C is a cross-sectional view taken along line II-II' of the ferroelectric memory device 6 in FIG. 6A. The ferroelectric memory device 6 illustrated in FIGS. 6A to 6C may be a three-dimensional transistor device having a saddle-type channel structure. The channel structure may be implemented in a form of a fin. According to an embodiment, the threshold switching layer 420 described above with reference to FIGS. 4 and 5A to 5C may be applied to the embodiment to be described with reference to FIGS. 6A to 6C.

Referring to FIGS. 6A to 6C, a semiconductor substrate 601 may be provided. The semiconductor substrate 601 may have a fin structure 6010 disposed to protrude upward. The semiconductor substrate 601 may, for example, have substantially the same configuration as the semiconductor substrate 401 of the embodiment described above and with reference to FIG. 4. In an embodiment, the semiconductor substrate 601 may be a doped single crystalline silicon (Si) substrate. In an embodiment, the fin structure 6010 may be formed of the same material as the semiconductor substrate 601.

Referring to FIGS. 6A and 6C, an interlayer insulation layer 605 surrounding the fin structure 6010 may be disposed on the semiconductor substrate 601. The interlayer insulation layer 605 may include, for example, silicon oxide, silicon nitride, silicon oxynitride, aluminum nitride, aluminum oxide or a combination of two or more thereof.

Referring to FIGS. 6A and 6B, the fin structure 6010 may have a trench 60. The trench 60 may have a bottom surface 601a extending in the x-direction and the y-direction and a sidewall surfaces 601b and 601c extending in the y-direction and the z-direction in the trench 60. An interfacial insulation layer 610 may be disposed on the bottom surface 601a and the sidewall surfaces 601b and 601c. A threshold switching layer 620 and a ferroelectric layer 630 may be sequentially disposed on the interfacial insulation layer 610. As illustrated in FIGS. 6A and 6C, the interfacial insulation layer 610, may be sequentially disposed over at least a portion of an upper surface 601d and side surfaces 601e and 601f of the fin structure 6010, and on an upper surface of the interlayer insulation layer 605. The threshold switching layer 620 and the ferroelectric layer 630 may be also sequentially disposed on the interfacial insulation layer 610. The configurations of the interfacial insulation layer 610, the threshold switching layer 620 and the ferroelectric layer 630 may be substantially the same as those of the interfacial insulation layer 410, the threshold switching layer 420 and the ferroelectric layer 430 described above and with reference to FIG. 4. However, in some embodiments, when the semiconductor substrate 601 and the threshold switching layer 620 form a chemically stable interface, the interfacial insulation layer 610 may be omitted. In such instances, the threshold switching layer 620 can be disposed directly on the semiconductor substrate 601. Depending on the orientation of the remanent polarization stored in the ferroelectric layer 630, charge may be induced into a channel region of the fin structure 6010, or the charge may be ejected from the channel region. The channel region may be formed in a region of the fin structure 6010 that interfaces with the interface insulation layer 610 and is located between a source region 670 and a drain region 690.

Meanwhile, referring to FIG. 6B, a gate electrode layer 650 may be disposed on the ferroelectric layer 630 disposed on the inner wall surfaces 601a, 601b and 601c of the trench 60. An upper conductive layer 655 may be disposed on the gate electrode layer 650. Referring to FIG. 6C, the gate electrode layer 650 and the upper conductive layer 655 may be sequentially arranged on the ferroelectric layer 630. Configurations of the gate electrode layer 650 and the upper conductive layer 655 may be substantially the same as those of the gate electrode layer 350 and the upper electrode layer 355 of the embodiment described above and with reference to FIGS. 3A, 3B and 3C.

Referring to FIGS. 6A and 6B, the source region 670 and the drain region 690 may be respectively disposed in the fin structure 6010 at positions opposite to each other with respect to the trench 60. The source region 670 and the drain region 690 may be doped with a dopant of a type different to that used in the fin structure 6010. As an example, when the fin structure 6010 is doped into p-type, the source region 670 and the drain region 690 may both be doped into n-type. As another example, when the fin structure 6010 is doped into n-type, the source region 670 and the drain region 690 may both be doped into p-type.

As described above, according to an embodiment of the present disclosure, the configuration of the ferroelectric memory device 4 described above and with reference to FIGS. 4 and 5A to 5C can be realized in a three-dimensional structure. Specifically, the ferroelectric memory device 6 may include the threshold switching layer 620 disposed between the fin structure 6010 and the ferroelectric layer 630. As described above, the threshold switching layer 620 can be turned on at a voltage equal to or higher than a predetermined threshold voltage and turned off at a voltage lower than the predetermined threshold voltage. As such, the polarization switching voltage provided to the ferroelectric layer 630 can be controlled by using the threshold switching operation of the threshold switching layer 620. Consequently, the operation reliability of the ferroelectric memory device 6 can be improved by controlling the ferroelectric layer 630 to perform the polarization switching operation with a higher polarization switching threshold voltage as discussed above in connection with FIG. 5C.

Figure 7A:
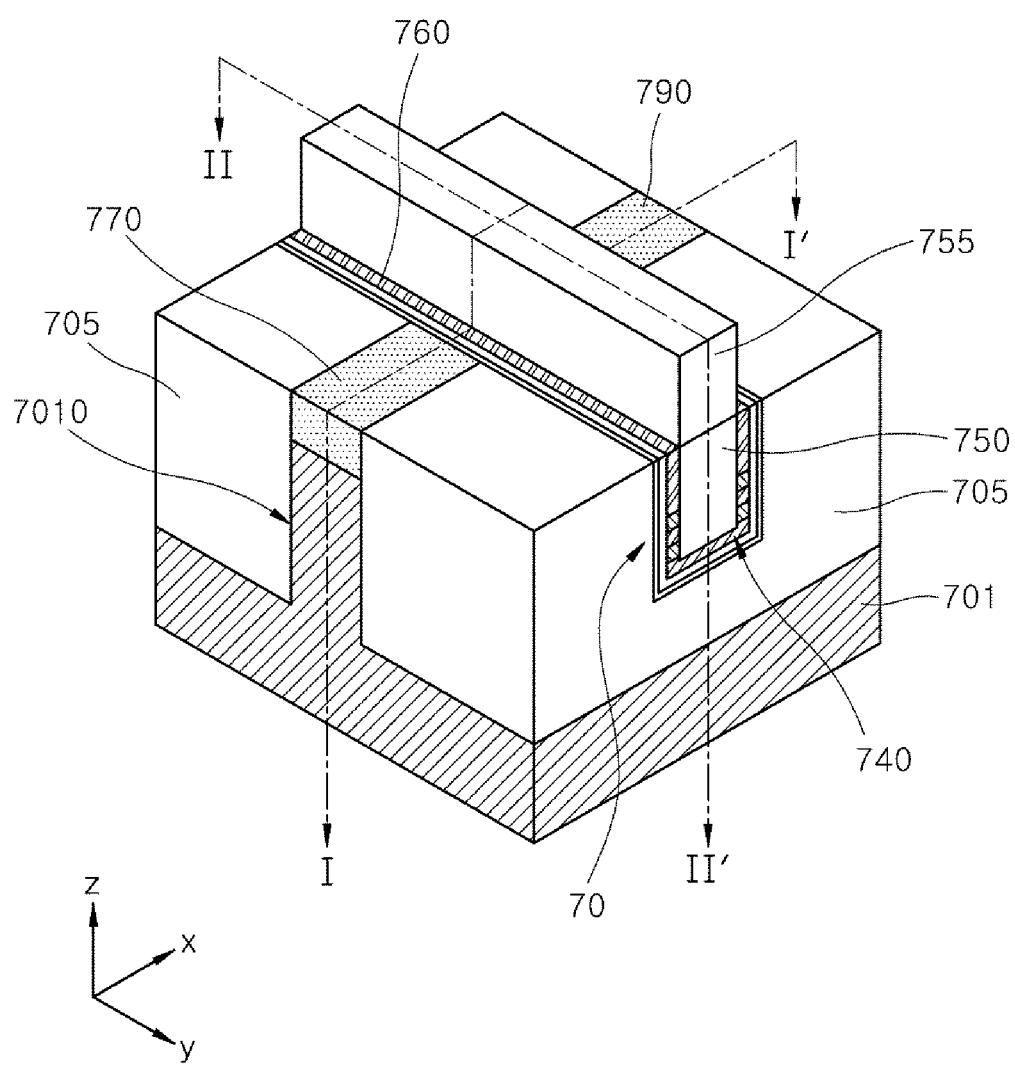
FIGS. 7A to 7D are views schematically illustrating a three-dimensional ferroelectric memory device according to an embodiment of the present disclosure.
Figure 7B:
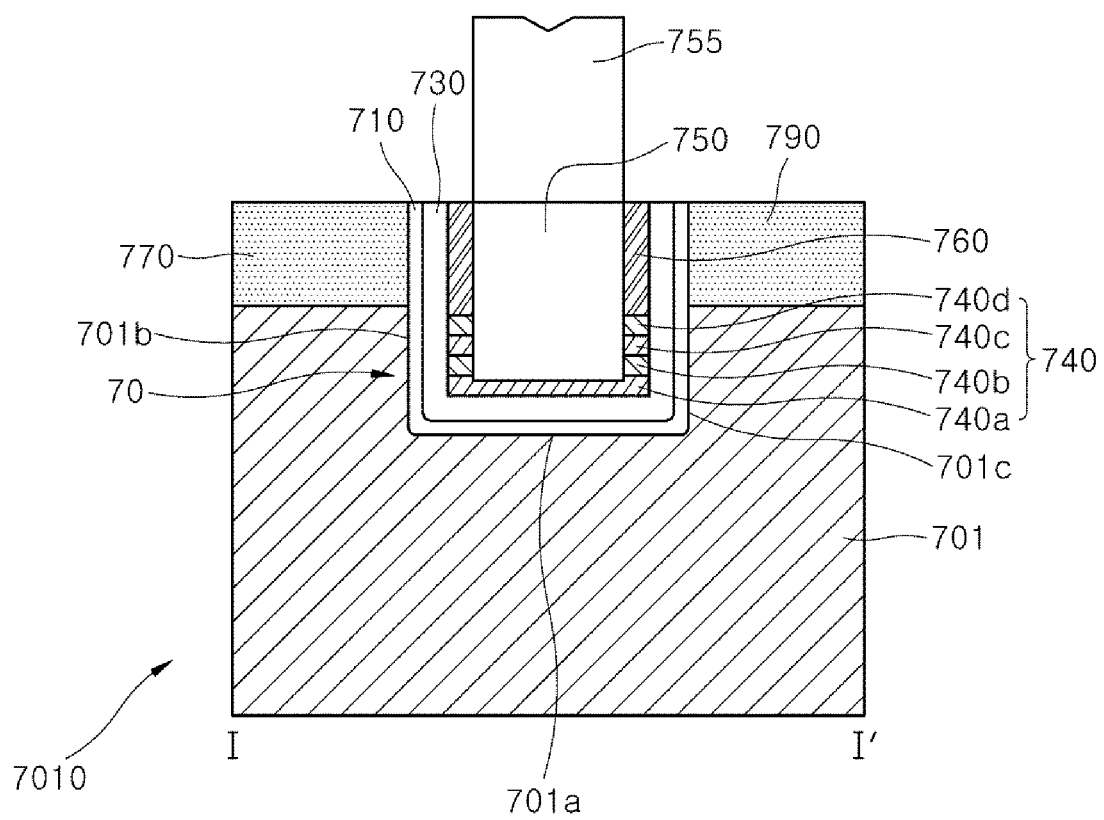
Figure 7C:
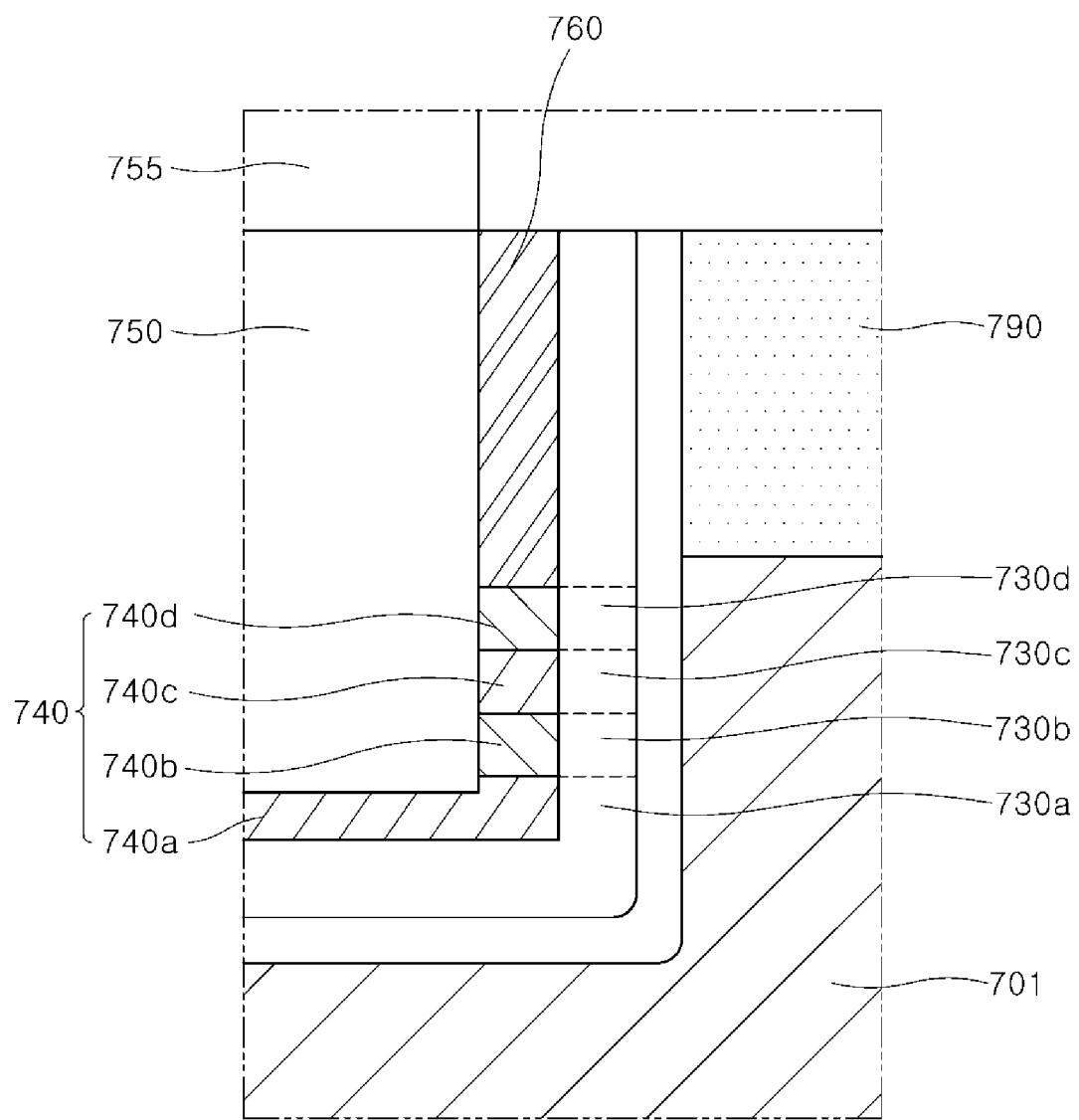
Figure 7D:
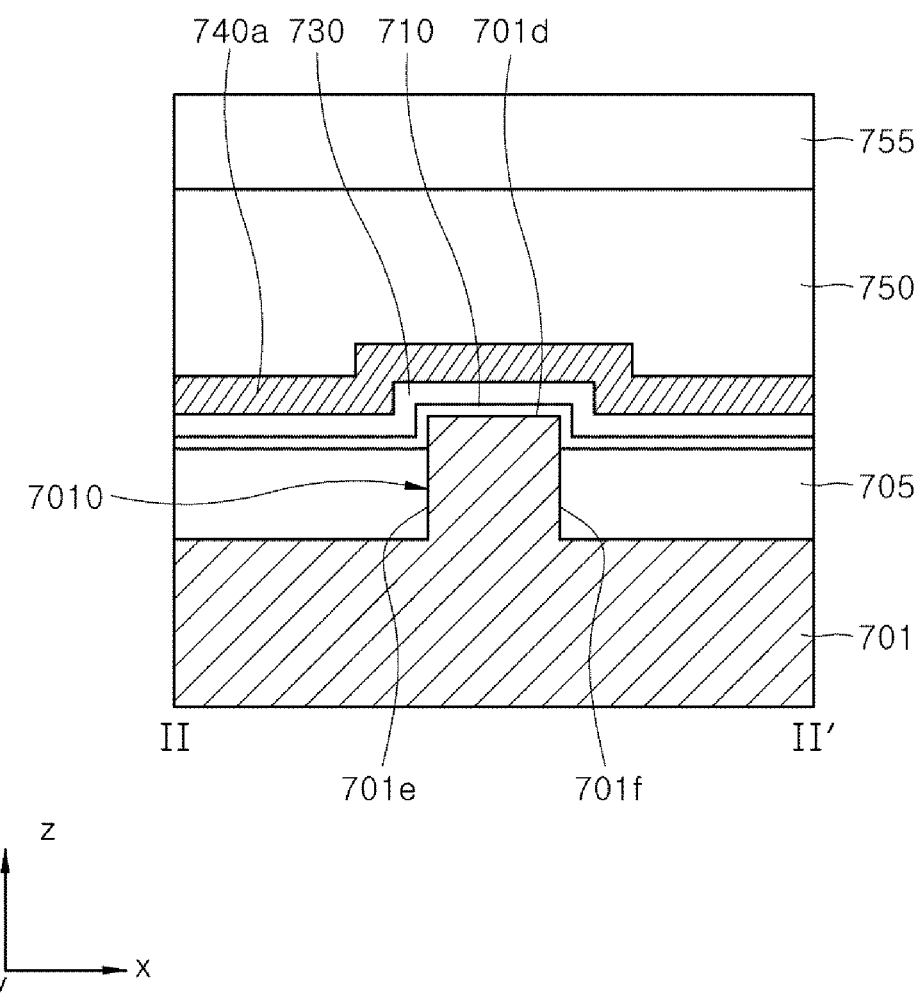

FIGS. 7A to 7D are views schematically illustrating a ferroelectric memory device 7 according to an embodiment of the present disclosure. Although FIGS. 7A to 7D are described with reference to an orthogonal xyz axis system for convenience, it should be apparent that other non-orthogonal axes may be used. Specifically, FIG. 7A is a perspective view of the ferroelectric memory device 7, FIG. 7B is a cross-sectional view taken along line I-I' of the ferroelectric memory device 7 in FIG. 7A, FIG. 7C is a partially enlarged view of FIG. 7B, and FIG. 7D is a cross-sectional view taken along line II-II' of the ferroelectric memory device 7 in FIG. 7A. The ferroelectric memory device 7 illustrated in FIGS. 7A to 7D may be a three-dimensional transistor device having a saddle-type channel structure. The channel structure may be implemented in a form of a fin.

Referring to FIGS. 7A to 7D, a semiconductor substrate 701 may be provided. The semiconductor substrate 701 may have a fin structure 7010 disposed to protrude upward. The semiconductor substrate 701 and the fin structure 7010 may, for example, have substantially the same configurations as the semiconductor substrates 301 and 601 and the fin structures 3010 and 6010 of the embodiments described above and with reference to FIGS. 3A to 3C and FIGS. 6A to 6C. In an embodiment, the semiconductor substrate 701 may be a doped single crystalline silicon (Si) substrate. In an embodiment, the fin structure 7010 may be formed of the same material as the semiconductor substrate 701.

Referring to FIGS. 7A and 7D, an interlayer insulation layer 705 surrounding the fin structure 7010 may be disposed on the semiconductor substrate 701. The interlayer insulation layer 705 may include, for example, silicon oxide, silicon nitride, silicon oxynitride, aluminum nitride, aluminum oxide or a combination of two or more thereof.

Referring to FIGS. 7A, 7B and 7C, the fin structure 7010 may have a trench 70. The trench 70 may have a bottom surface 701*a* extending in the x-direction and the y-direction and sidewall surfaces 701*b* and 701*c* extending in the y-direction and the z-direction in the trench 70. An interfacial insulation layer 710 may be disposed on the bottom surface 701*a* and the sidewall surfaces 701*b* and 701*c* of the trench 70. A ferroelectric layer 730 may be disposed on the interfacial insulation layer 710. As illustrated in FIGS. 7A and 7D, the interfacial insulation layer 710 may be disposed over at least a portion of an upper surface 701*d* and side surfaces 701*e* and 701*f* of the fin structure 7010 and on an upper surface of the interlayer insulation layer 705. The configurations of the interfacial insulation layer 710 and the ferroelectric layer 730 may be substantially the same as those of the interfacial insulation layer 610 and the ferroelectric layer 630 described above and with reference to FIGS. 6A to 6C.

Meanwhile, referring to FIGS. 7B and 7C, a resistive structure 740 stacked in a vertical direction may be disposed in the trench 70. The resistive structure 740 may be layered on the ferroelectric layer 730 located on the bottom surface 701*a* of the trench 70. The resistive structure 740 may include a plurality of resistor layers 740*a*, 740*b*, 740*c* and 740*d* each having different electrical resistances. Although first through fourth resistor layers 740*a*, 740*b*, 740*c* and 740*d* are illustrated in FIGS. 7A, 7B and 7C as an example, the present disclosure is not necessarily limited thereto, and the ferroelectric memory device 7 may include various numbers of the resistor layers.

Each resistor layer of the plurality of resistor layers 740*a*, 740*b*, 740*c* and 740*d* may contact different portion of the ferroelectric layer 730 along the sidewall surfaces 701*b* and 701*c* of the trench 70. That is, each resistor layer may contact different portion of the ferroelectric layer 730 in a lateral direction. As illustrated in FIG. 7C, the first resistor layer 740*a* may contact a first portion 730*a* of the ferroelectric layer 730. Similarly, the second, third and fourth resistor layers 740*b*, 740*c* and 740*d* may contact second, third and fourth portions 730*b*, 730*c* and 730*d* of the ferroelectric layer 730, respectively. An upper surface of the fourth resistor layer 740*d* may be located below the lower surfaces of the source region 770 and drain region 790.

The first to fourth resistor layers 740*a*, 740*b*, 740*c* and 740*d* may have different electrical resistances. The first to fourth resistor layers 740*a*, 740*b*, 740*c* and 740*d* may be stacked or arranged to create or implement a gradient of electrical resistance. As examples, the first to fourth resistance layer layers 740*a*, 740*b*, 740*c* and 740*d* may be stacked or arranged in order of sequentially decreasing resistance or sequentially increasing resistance. The first to fourth resistor layers 740*a*, 740*b*, 740*c* and 740*d* may each include metal oxide having different oxygen vacancy concentrations, respectively. Oxygen vacancies can produce conductive carriers in the metal oxide. As the oxygen vacancy concentration increases, the resistance of the metal oxide may decrease. The metal oxide may include, for example, zirconium oxide, hafnium oxide, tungsten oxide, titanium oxide, nickel oxide, copper oxide, manganese oxide, tantalum oxide, niobium oxide, iron oxide or a combination of two or more thereof.

Referring to FIGS. 7B and 7C, a gate electrode layer 750 may be disposed to contact the resistive structure 740 in the trench 70. An upper conductive layer 755 may be disposed on the gate electrode layer 750. The gate electrode layer 750 may be disposed to contact each resistor layer of the first to fourth resistor layers 740*a*, 740*b*, 740*c* and 740*d*. That is, the gate electrode layer 750 may be electrically connected to each resistor layer of the first to fourth resistor layers 740*a*, 740*b*, 740*c* and 740*d*. A configuration of the gate electrode layer 750 may be substantially the same as that of the gate electrode layer 650 of the ferroelectric memory device 6 described above and with reference to FIGS. 6A to 6C.

Within the trench 70, a buried insulation layer 760 may be disposed on the resistive structure 740. The buried insulation layer 760 may be disposed between the ferroelectric layer 730 and the gate electrode layer 750. A lower surface of the buried insulation layer 760 may be located below the lower surfaces of the source region 770 and drain region 790.

An operation method of the ferroelectric memory device 7 will be described with reference to FIGS. 7B and 7C. Since the first to fourth resistor layers 740*a*, 740*b*, 740*c* and 740*d* having different resistances are disposed between the gate electrode layer 750 and the ferroelectric layer 730, when a predetermined voltage is applied through the gate electrode layer 750, the voltage applied to the ferroelectric layer 730 may be different common to the first through fourth resistor layers 740*a*, 740*b*, 740*c* and 740*d*. Accordingly, the polarization switching operation may be performed under different conditions for each of the first through fourth portions 730*a*, 730*b*, 730*c*, and 730*d* of the ferroelectric layer 730.

As an example, the first to fourth resistor layers 740*a*, 740*b*, 740*c* and 740*d* may be disposed so that the electrical resistances are sequentially decreased. That is, the resistance of the first resistor layer 740*a* may be the greatest, and the resistance of the fourth resistor layer 740*d* may be the smallest. In an embodiment, a first voltage may be applied to the gate electrode layer 750 to generate a polarization switching operation only as to the fourth portion 730*d* of the ferroelectric layer 730. In another embodiment, a second voltage higher than the first voltage may be applied to the gate electrode layer 750 to generate a polarization switching operation only as to the third and fourth portions 730*c* and 730*d* of the ferroelectric layer 730. In another embodiment, a third voltage higher than the second voltage may be applied to the gate electrode layer 750 to generate a polarization switching operation only as to the second to fourth portions 730*b*, 730*c* and 730*d* of the ferroelectric layer 730. In another embodiment, a fourth voltage higher than the third voltage may be applied to the gate electrode layer 750 to generate a polarization switching operation in each of the first to fourth portions 730*a*, 730*b*, 730*c* and 730*d* of the ferroelectric layer 730.

As described above, the amount of polarization switching can vary for each portion of the ferroelectric layer 730. Depending on the amount of the switched polarization, different amounts of charges may be induced in a channel region of the fin structure 7010, so that the channel resistances can be differentiated from each other. This allows the ferroelectric memory device to implement multi-level signal information. The channel region may be formed between the source region 770 and the drain region 790 in a region of the fin structure 7010 that interfaces with the interfacial insulation layer 710.

According to some embodiments, configurations of the above-described resistive structure 740 and the buried insulation layer 760 may be applied to the ferroelectric memory device 3 of the embodiment described above and in connection with FIGS. 3A, 3B and 3C, and to the ferroelectric memory device 6 of the embodiment described above and in connection with FIGS. 6A, 6B and 6C, in substantially the same manner. That is, the resistive structure 740 and the buried insulation layer 760 may be disposed between the ferroelectric layer 330 and the gate electrode layer 350 or between the ferroelectric layer 630 and the gate electrode layer 650, of the ferroelectric memory devices 3 and 6, respectively.

As described above, according to an embodiment, the ferroelectric memory device 7 having the plurality of resistor layers 740a, 740b, 740c and 740d disposed between the ferroelectric layer 730 and the gate electrode layer 750 can be provided. Each of the plurality of resistor layers 740a, 740b, 740c and 740d may have a different resistance. It is possible to control the polarization switching for each of the portions 730a, 730b, 730c and 730d of the ferroelectric layer 730 in contact with the plurality of resistor layers 740a, 740b, 740c and 740d when a voltage is applied to the gate electrode layer 750. As a result, multi-level signal information can be effectively stored in the ferroelectric layer 730 by using the polarization switching control method described above.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
a semiconductor substrate;
a fin structure disposed on the semiconductor substrate and having a trench, the trench having a bottom surface and a sidewall surface;
a ferroelectric layer disposed on the bottom surface and the sidewall surface of the trench;
a plurality of resistor layers stacked vertically in the trench, each resistor layer of the plurality of resistor layers having a different electrical resistance; and
a gate electrode layer electrically connected to the each resistor layer in the plurality of resistor layers,
wherein the plurality of resistor layers are disposed between the gate electrode layer and the ferroelectric layer,
the each resistor layer of the plurality of resistor layers contacts a different portion of the ferroelectric layer along the sidewall surface of the trench.

2. The ferroelectric memory device of claim 1, further comprising:
a source region and a drain region disposed in the fin structure at locations opposite to each other with respect to the trench.

3. The ferroelectric memory device of claim 1, wherein the each resistor layer of the plurality of resistor layers comprises metal oxide having a different oxygen vacancy concentration.

4. The ferroelectric memory device of claim 3, wherein the metal oxide comprises at least one of zirconium oxide, hafnium oxide, tungsten oxide, titanium oxide, nickel oxide, copper oxide, manganese oxide, tantalum oxide, niobium oxide and iron oxide.

5. The ferroelectric memory device of claim 1, wherein the plurality of resistor layers are arranged to implement a gradient of electrical resistance.

6. The ferroelectric memory device of claim 1, wherein the gate electrode layer contacts the each resistor layer of the plurality of resistor layers inside the trench.

7. The ferroelectric memory device of claim 1, wherein the ferroelectric layer comprises at least one of hafnium oxide (HfO2), zirconium oxide (ZrO2) and hafnium zirconium oxide (Hf0.5Zr0.5O2).

8. The ferroelectric memory device of claim 1, further comprising:
an interfacial insulation layer disposed between the ferroelectric layer and the fin structure,
wherein the interfacial insulation layer comprises at least one of silicon oxide, silicon nitride and silicon oxynitride.

9. The ferroelectric memory device of claim 8, further comprising:
a threshold switching layer disposed between the ferroelectric layer and the interfacial insulation layer,
wherein the threshold switching layer comprises at least one of silicon oxide, silicon nitride, aluminum oxide, zirconium oxide, hafnium oxide, tungsten oxide, titanium oxide, nickel oxide, copper oxide, manganese oxide, tantalum oxide, niobium oxide, and iron oxide.

10. The ferroelectric memory device of claim 9, wherein the threshold switching layer comprises at least one of aluminum (Al), lanthanum (La), niobium (Nb), vanadium (V), tantalum (Ta), tungsten (W), chromium (Cr), molybdenum (Mo), copper (Cu), zirconium (Zr), hafnium (Hf), titanium (Ti), and nickel (Ni) as a dopant.

11. The ferroelectric memory device of claim 1, further comprising:
a channel layer disposed between the ferroelectric layer and the fin structure and having an epitaxial film,
wherein the epitaxial film comprises silicon germanium (SiGe) or silicon carbide (SiC).

12. The ferroelectric memory device of claim 11, wherein a surface of the channel layer includes elemental germanium (Ge) of the silicon germanium or elemental carbon (C) of the silicon carbide (SiC).

13. A ferroelectric memory device comprising:
a semiconductor substrate including a trench, the trench having a bottom surface and a sidewall surface;
a ferroelectric layer disposed on the bottom surface and the sidewall surface of the trench;
a plurality of resistor layers disposed to contact the ferroelectric layer, each resistor of the plurality of resistor layers having a different electrical resistance; and
a gate electrode layer electrically connected to each resistor layer in the plurality of resistor layers,
wherein the each resistor layer of the plurality of resistor layers contacts a different portion of the ferroelectric layer along the sidewall surface of the trench.

14. The ferroelectric memory device of claim 13, further comprising:
a source region and a drain region disposed in the substrate at locations opposite to each other with respect to the trench.

15. The ferroelectric memory device of claim 13, wherein the each resistor layer of the plurality of resistor layers comprises metal oxide having a different oxygen vacancy concentration.

16. The ferroelectric memory device of claim 13, wherein the plurality of resistor layers are arranged to implement a gradient of electrical resistance.

17. The ferroelectric memory device of claim 13, wherein the gate electrode layer contacts the each resistor layer of the plurality of resistor layers inside the trench.

18. The ferroelectric memory device of claim 13, further comprising:

an interfacial insulation layer disposed between the ferroelectric layer and the substrate,
wherein the interfacial insulation layer comprises at least one of silicon oxide, silicon nitride and silicon oxynitride.

* * * * *